TRANSISTOR-DETECTOR
Filed June 3, 1954
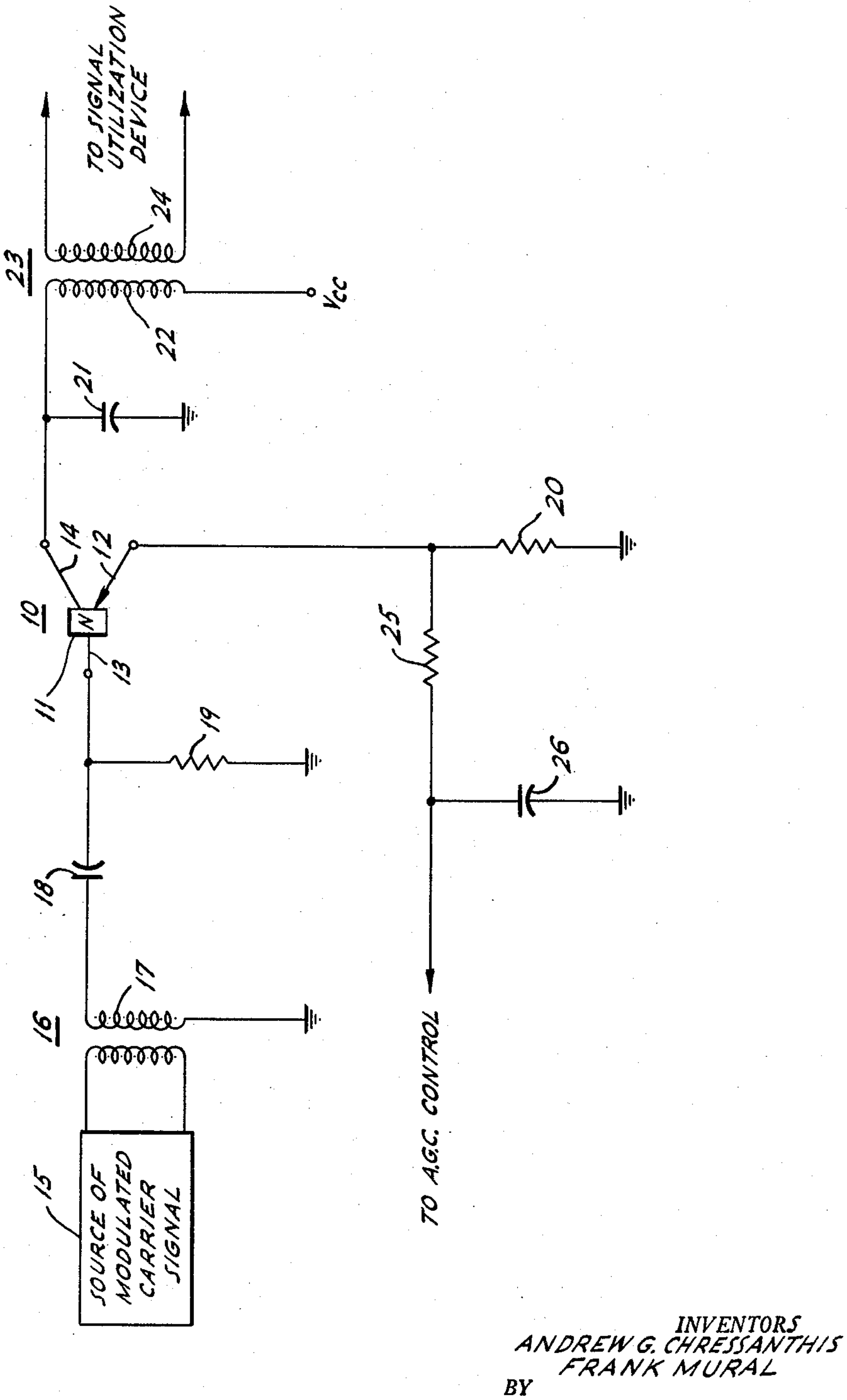
INVENTORS
ANDREW G. CHRESSANTHIS
FRANK MURAL
BY
Dillen V. Hagstrome
ATTORNEY United States Patent Office 2,807,718

Patented Sept. 24, 1957

2,807,718

TRANSISTOR-DETECTOR

Andrew G. Chressanthis, Philadelphia, and Frank Mural, Drexel Hill, Pa., assignors to Philco Corporation, Philadelphia, Pa., a corporation of Pennsylvania Application June 3, 1954, Serial No. 434,188

1 Claim. (Cl. 250—31)

This invention relates to new and improved circuits which utilize semi-conductor amplifier elements and, more particularly, to new circuits which utilize semi-conductor amplifier elements to detect and amplify the amplitude modulation of a carrier wave.

It is well known that detection of the amplitude modulation of a carrier wave can be carried out by circuit elements constituted principally of semi-conductor material. However the semi-conductor elements which have been used in the past for this purpose have uniformly been mere rectifier elements. Such rectifier elements are characterized by the presence of only two electrodes in contact with the body of semi-conductor material. Of these electrodes one has ohmic characteristics, which means that it is substantially equally transmissive of current in both directions, while the other has so-called rectifying characteristics, which means that it transmits current much more readily in one direction than in the other. It is known that this form of detector element inevitably introduces attenuation into the detected signal. In most applications of such detector elements such attenuation is not only undesirable but, on the contrary, considerable amplification of the detected output signal is required for the proper operation of the utilization devices to which the detected signal is supplied. Consequently the use of semi-conductor detectors of the prior art form necessitated the use of additional amplifier elements which, in turn, increased the cost and complexity of the equipment in which they were incorporated.

Accordingly it is a primary object of the invention to provide an improved circuit for detecting the amplitude modulation of a carrier wave.

It is another object of the invention to provide a circuit which utilizes a semi-conductor element for the detection of an amplitude modulated signal and which is characterized in that it does not attenuate appreciably the detected signal.

It is a further object of the invention to provide a new circuit in which a single semi-conductor element is utilized both to detect and to amplify the amplitude modulation of a carrier wave.

In accordance with our invention these objects, as well as others which will appear, are achieved by means of a detector circuit which utilizes for the detecting element, not a two electrode semi-conductor detector element, as heretofore, but rather a three electrode semi-conductor amplifier element. The amplitude modulated carrier wave, whose modulation it is desired to detect, is applied to this element between two of its electrodes and the detected modulation components are derived therefrom between one of these two electrodes and the third electrode. By reason of certain details of circuit construction and by reason of certain distinctive characteristics of such semi-conductor amplifier elements, the nature and importance of which will be described in detail hereinafter, such a combined detector and amplifier circuit has detection and amplification characteristics which are considerably superior to those of other circuits which have previously been used for the same purpose.

The details of construction and operation of circuits embodying this invention will be understood more readily by reference to the circuit illustrated in the accompanying single figure of drawings, which constitutes a preferred embodiment of our invention.

This circuit includes a semi-conductor amplifier element 10 which may be of any known form. For example, this element may be of the so-called point contact form, or of the junction form, or of the surface barrier form. While these various forms of semi-conductor amplifier elements present different physical appearances and differ in respect of certain important operational characteristics, they all have in common a number of basic features which are utilized in the circuit embodying the invention. In particular each one of these elements consists essentially of a body of semi-conductor material, designated by reference numeral 11 in the figure and contacted by three electrodes 12, 13 and 14. Two of these electrodes form rectifying contacts with the body of semi-conductor material, while the third forms an ohmic contact with this material. When a forward bias potential is applied between one of these rectifying electrodes, e. g. electrode 12, and the ohmic electrode 13 and when a reverse bias potential is applied between the other rectifying electrode 14 and the ohmic electrode 13 then the element is in condition for producing an output current in its reversely biased electrode 14 in response to an input current supplied to its ohmic electrode 13. The forwardly biased rectifying electrode 12 is conventionally known as the emitter electrode, while the reversely biased rectifying electrode 14 is known as the collector electrode and the ohmic electrode 13 is known as the base electrode. The respective electrodes will therefore be designated by these common reference terms in the discussion which follows.

In accordance with the invention the base electrode 13 is supplied with an amplitude modulated carrier signal from a source 15 of such a carrier signal by way of a coupling transformer 16 whose secondary winding 17 has one terminal connected to ground and the other to the base electrode 13, the latter connection being effected by way of a capacitor 18. Also connected between base electrode 13 and ground is a bias resistor 19. The function of capacitor 18 and resistor 19 will be explained hereinafter. The particular form which the source 15 of modulated carrier signal may take is of no importance to our invention. Assuming, for example, that our detector circuit is being used in a broadcast receiver, then this source may include those components of a broadcast receiver which conventionally precede its second detector and which include a radio frequency amplifier, a converter for transforming the received radio frequency wave into an intermediate frequency wave and a suitable number of stages of intermediate frequency amplification. Under these circumstances transformer 16 may be the output transformer of the last stage of intermediate frequency amplification.

The circuit which embodies our invention further comprises a resistor 20 which connects the emitter 12 to ground, and a capacitor 21 which connects the collector 14 to ground. The collector 14 is also connected to one terminal of the primary winding 22 of a transformer 23 which is conventionally constructed and arranged to transfer signals in the detected signal frequency range to the secondary winding 24 of this transformer and thence to any appropriate signal utilization device (not shown). The terminal of primary winding 22 which is not connected to collector 14 is connected, instead, to a conventional source of reverse collector bias potential $V_{cc}$.

The operation of this circuit is as follows. An amplitude modulated carrier signal from source 15 is developed between ground and the base electrode 13 of the semi-conductor amplifier element 10, by way of transformer 16, capacitor 18 and resistor 19. It is apparent that, upon initial application of this carrier signal to the element, positive excursions of the carrier signal will cause the base electrode 13 to assume positive potentials with respect to ground potential, while alternate negative signal excursions will cause the base electrode to become negative with respect to ground potential. Since the semi-conductor element may be assumed to be initially non-conducting, its emitter electrode 12 will also be initially at ground potential and the aforenoted alternate positive and negative excursions of the carrier signal will give rise to alternate positive and negative potential differences between emitter and base electrodes.

Assuming now, for purposes of illustration only, that the semi-conductor element is of the P–N–P junction type, then, as is well known, collector current will flow in this element whenever its base is more negative than its emitter. In the present case, this condition will occur during negative excursions of the applied carrier signal. The collector current which flows under these circumstances follows a path leading from the ground connection through emitter resistor 20, emitter electrode 12, collector electrode 14 and back to ground through the parallel combination of output transformer winding 22 and capacitor 21. During positive excursions of the carrier signal, during which the base electrode assumes a positive potential relative to the emitter, the semi-conductor element will be substantially cut off and no appreciable current will flow in its collector electrode.

Thus there will be produced, in the collector-to-emitter circuit of the semi-conductor element, a replica of the negative half-cycles of the applied carrier signal. The amplitude of the rectified signal thus produced in the output circuit will have an amplitude which varies in accordance with the amplitude modulation of the applied carrier wave. These amplitude variations, which constitute the useful output signal of the detector circuit, are developed across output transformer winding 22 while the carrier frequency variations are by-passed around this winding by capacitor 21.

The principal advantages of a circuit embodying our invention will now be apparent.

First, the detected output signal is the modulation envelope of carrier signal excursions of one polarity (negative in the illustrative case under consideration). Since semi-conductor amplifier elements, when connected in the manner illustrated, produce collector current variations which are substantially linearly related to applied signal variations within the entire conduction range of the element, the detected output signal will be unusually free from the distortion which is commonly produced, in conventional detector circuits, by the greater non-linearity of their detector elements within the conduction range. This improvement is particularly conspicuous for carrier signals of small amplitude (corresponding to large modulation components) since the linearity of the input-output relationship persists, in the circuit embodying our invention, even within the region which is close to cut-off for the semi-conductor element. By contrast, other detector circuits become extremely non-linear within the small signal region.

Secondly, it will be noted that the detected amplitude variations will exceed in amplitude the amplitude modulation of the applied carrier signal because of the inherent amplifier characteristics of the semi-conductor element.

Before proceeding it should be noted that types of semi-conductor amplifier elements other than the P–N–P junction type under discussion may require for conduction an emitter-to-base potential of polarity opposite to that assumed for illustration. Thus, the so-called N–P–N junction type of element conducts when the base is positive relative to the emitter. However, since the applied carrier signal has alternate positive and negative excursions, either requirement will be met by this signal.

The aforenoted output current which flows in the emitter-to-collector path establishes an output potential not only across the output transformer winding 22 but also across the emitter resistor 20. Since output current can flow only in one given direction, the potential developed across this emitter resistor will have an average value proportional to the amplitude of the carrier signal and will be of one given polarity. This average potential may be derived by means of a low-pass filter comprised of resistor 25 and capacitor 26 and utilized for automatic gain control of other stages of the receiver in conventional manner. In addition this emitter resistor also serves to match the input impedance of the detector-amplifier circuit to the output impedance of the signal source 15. To this end the resistor is provided with a resistance value which may be determined by the application of conventional principles of semi-conductor circuit design for any particular situation.

While, as has been seen, this emitter resistor 20 serves several important functions it also introduces certain problems which must be overcome. In particular, assuming again that the semi-conductor element 10 is of the so-called P–N–P junction type, the average potential which is developed across this resistor is of such polarity that the emitter-connected end of the resistor becomes more negative than its grounded end. If, under these circumstances, the modulated carrier signal were applied directly to the base electrode 13, without the intervention of capacitor 18 and resistor 19, then the base potential would be subject to equal positive and negative excursions from ground potential. Negative excursions of considerable amplitude would then be required merely to overcome the negative potential applied to the emitter by emitter resistor 20, while only negative excursions in excess of this amplitude would succeed in actually driving the semi-conductor element into conduction. However, under conditions of modulation approaching one-hundred percent modulation, the carrier wave amplitude might not exceed this minimum amplitude at all during peaks of the modulation components. In consequence, the modulation components corresponding to this extreme condition would not be reproduced in the output signal at all and the detected signal would no longer be a faithful replica of these modulation components. This danger is eliminated by the cooperative action of capacitor 18 and resistor 19 in the following manner. Base current flows into capacitor 18 during negative excursions of the applied signal and charges this capacitor, which then discharges through resistor 19 during positive signal excursions. Thus there is established an average bias potential across resistor 19 which, by selection of the values of capacitor 18 and resistor 19 in accordance with conventional criteria, can be caused to equal the potential developed across emitter resister 20. Since the potential across resistor 19 is also of the same polarity as that across resistor 20 and since each resistor has one terminal connected to ground, the bias potentials developed across these resistors cancel each other and the average potential difference between emitter and base electrodes remains substantially zero.

The foregoing discussion assumes that cut-off of the semi-conductor element is reached when the base and emitter electrode are at the same potential. It will be understood, however, that, should cut-off correspond to some other potential relationship between base and emitter electrodes, then the resistor 19 and the capacitor 18 need merely be provided with different values in order to establish the different desired relationship. In any case, the important requirement which must be met is to maintain the average potential difference between base and emitter electrodes at the cut-off value for the particular semi-conductor element used.

It will be apparent, from the foregoing, that other modifications of the embodiment illustrated will occur to those skilled in the art without departing, however, from our inventive concept. Accordingly we desire the scope of our invention to be limited only by the appended claim.

We claim:

A combined detector, amplifier and AGC circuit, comprising a transistor having at least emitter, collector and base elements, passive circuit means for biasing said base element at substantially the same potential as said emitter element, means for biasing said collector element in the direction to attract minority-carriers injected by said emitter, means for applying amplitude-modulated, carrier-wave signals between said base element and a point of reference potential, a collector load impedance connected to said collector element and having a relatively high impedance at the frequency of said modulation and a relatively low impedance at the frequency of said carrier, a substantially resistive emitter load impedance connected between said emitter element and said source of reference potential, and a low-pass filter circuit supplied with signals developed across said emitter load impedance for deriving a control signal varying substantially in proportion to variations in the strength of said carrier wave.

References Cited in the file of this patent

UNITED STATES PATENTS

| | | |
|---|---|---|
| 1,770,838 | Carlson | July 15, 1930 |
| 2,128,996 | Foster | Sept. 6, 1938 |
| 2,486,776 | Barney | Nov. 1, 1949 |
| 2,663,796 | Raisbeck | Dec. 22, 1953 |